United States Patent
Chang et al.

(10) Patent No.: US 9,476,135 B2
(45) Date of Patent: Oct. 25, 2016

(54) ELECTRO CHEMICAL PLATING PROCESS

(71) Applicant: Taiwan Semiconductor Manufacturing Co. Ltd., Hsin-Chu (TW)

(72) Inventors: Chih-Yi Chang, New Taipei (TW); Liang-Yueh Ou Yang, New Taipei (TW); Chen-Yuan Kao, Zhudong Township (TW); Hung-Wen Su, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 607 days.

(21) Appl. No.: 13/858,994

(22) Filed: Apr. 9, 2013

(65) Prior Publication Data

US 2014/0262797 A1    Sep. 18, 2014

Related U.S. Application Data

(60) Provisional application No. 61/777,304, filed on Mar. 12, 2013.

(51) Int. Cl.
| | |
|---|---|
| *C25D 5/18* | (2006.01) |
| *C25D 7/12* | (2006.01) |
| *C25D 5/02* | (2006.01) |
| *C25D 3/38* | (2006.01) |
| *C25D 17/00* | (2006.01) |
| *C25D 17/10* | (2006.01) |

(Continued)

(52) U.S. Cl.
CPC . *C25D 5/02* (2013.01); *C25D 3/38* (2013.01); *C25D 5/18* (2013.01); *C25D 7/123* (2013.01); *C25D 17/001* (2013.01); *C25D 17/002* (2013.01); *C25D 17/007* (2013.01); *C25D 17/10* (2013.01); *H01L 21/2885* (2013.01); *H01L 21/76877* (2013.01)

(58) Field of Classification Search
CPC .......... C25D 5/02; C25D 7/123; C25D 5/18; C25D 17/001
USPC ........................................ 205/123, 125, 118
See application file for complete search history.

(56) References Cited

U.S. PATENT DOCUMENTS

| | | | | |
|---|---|---|---|---|
| 2002/0027080 | A1* | 3/2002 | Yoshioka | C25D 17/02 205/123 |
| 2004/0084315 | A1* | 5/2004 | Mizohata | C25D 21/00 205/82 |
| 2006/0081478 | A1* | 4/2006 | Sahoda | C25D 5/08 205/148 |

(Continued)

OTHER PUBLICATIONS

P.M. Vereecken, et al.; "The Chemistry of Additives in Damascene Copper Plating"; IBM J. Res. & Dev., vol. 49, No. 1, Jan. 2005, p. 3-18.

*Primary Examiner* — Bryan D. Ripa
(74) *Attorney, Agent, or Firm* — Eschweiler & Associates, LLC

(57) ABSTRACT

The present disclosure relates to an electro-chemical plating (ECP) process which utilizes a dummy electrode as a cathode to perform plating for sustained idle times to mitigate additive dissociation. The dummy electrode also allows for localized plating function to improve product gapfill, and decrease wafer non-uniformity. A wide range of electroplating recipes may be applied with this strategy, comprising current plating up to approximately 200 Amps, localized plating with a resolution of approximately 1 mm, and reverse plating to remove material from the dummy electrode accumulated during the dummy plating process and replenish ionic material within the electroplating solution.

19 Claims, 7 Drawing Sheets

(51) Int. Cl.
*H01L 21/288* (2006.01)
*H01L 21/768* (2006.01)

(56) References Cited

U.S. PATENT DOCUMENTS

| | | | |
|---|---|---|---|
| 2006/0213778 A1* | 9/2006 | Cheng | C25D 5/02 205/105 |
| 2006/0243598 A1* | 11/2006 | Singh | C25D 5/04 205/260 |
| 2008/0223724 A1* | 9/2008 | Chen | H01L 21/2885 205/96 |
| 2010/0044236 A1* | 2/2010 | Mayer | C23C 18/1601 205/80 |
| 2010/0276292 A1* | 11/2010 | Webb | C25D 3/38 205/230 |
| 2011/0290641 A1* | 12/2011 | Weiner | C25D 17/005 204/275.1 |
| 2014/0144781 A1* | 5/2014 | He | C25D 17/001 205/96 |

* cited by examiner

# ELECTRO CHEMICAL PLATING PROCESS

CROSS REFERENCE TO RELATED APPLICATIONS

This application is a Non-Provisional application claiming priority to Provisional Patent Application Ser. No. 61/777,304 filed on Mar. 12, 2013 in the name of Chih-Yi Chang, et al., entitled "An Electro Chemical Plating Process" and is hereby incorporated by reference.

BACKGROUND

Integrated chips (IC) are manufactured by subjecting a semiconductor workpiece to multiple fabrication steps. Among these, layer deposition processes are utilized to form IC components such as polysilicon gate material and metal interconnect layers within a cavity of a dielectric layer. Deposition processes include physical vapor deposition (PVD), electro-chemical plating (ECP), atomic layer deposition (ALD), etc., and require static tool calibration to maintain consistent manufacturing throughput with minimal lot-to-lot variability.

DETAILED DESCRIPTION

Figure 1A:
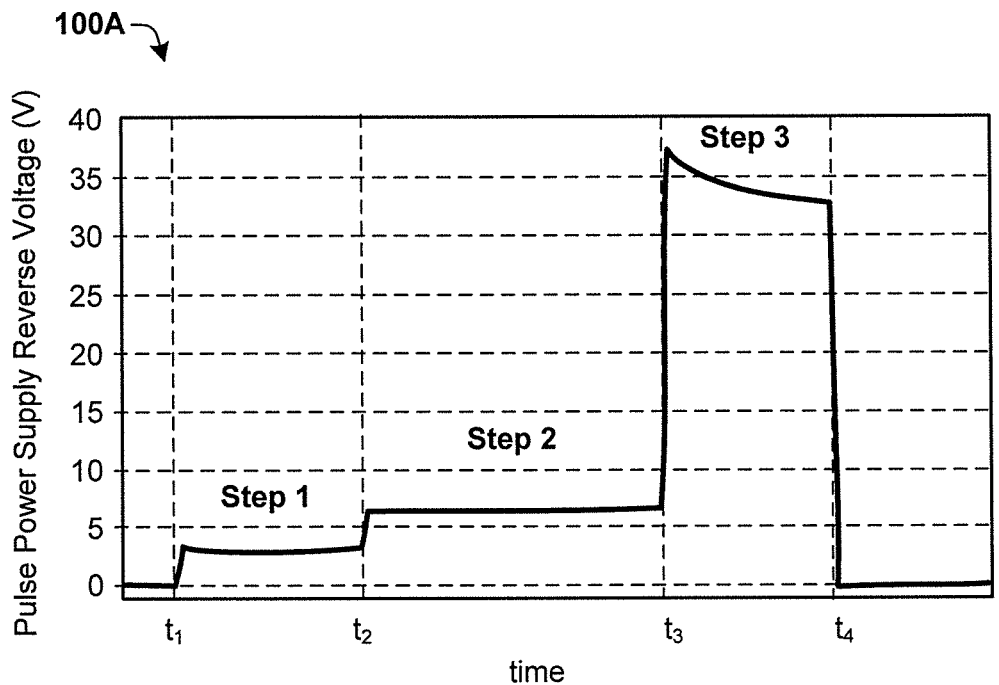
FIGS. 1A-1B illustrate a voltage vs. time characteristic of a three-step electro-chemical plating (ECP) process before and after a sustained idle period by an ECP system.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Electro-chemical plating (ECP) processes deposit a layer of material onto a substrate by electrolytic deposition, wherein a substrate is submerged into an electroplating solution comprising ions of a material to be deposited. A DC voltage is applied to the substrate, causing it to act as a cathode which attracts cations of the electroplating solution, which reduce and accumulate over the substrate to form a thin film. FIG. 1A illustrates a voltage vs. time characteristic 100A of a three-step ECP process comprising a copper (Cu) deposition process, wherein a dielectric layer disposed is over a substrate which has been patterned, developed, and etched to form trenches which are to be filled by the three-step ECP process. After deposition of one or more seed layers, the three-step ECP process further comprises a first step for filling comparatively narrow trenches and vias which is performed with a first bias for a first duration of approximately $t_2-t_1$, a second step for filling comparatively wide trenches performed with a second bias for a second duration of approximately $t_3-t_2$, and a third step for bulk film deposition performed with a third bias for a third duration of approximately $t_4-t_3$.

The three-step ECP process is performed within an ECP system, wherein damascene plating is performed within an electroplating solution comprising a copper plating bath further comprising an ionized cuprous species ($Cu^+$) or an ionized cupric species ($Cu^{2+}$). The electroplating solution also contains a plurality of additives which facilitate the electrolytic deposition within the trenches. The additives react with cuprous intermediates near the copper surface to regulate the presence of the cuprous species or cupric species over the surface. Levelers and suppressors inhibit cuprous species or cupric species formation, whereas accelerating additives enhance cuprous species or cupric species formation. Ionized protons $H^+$ are provided to the electroplating solution through a cationic membrane to moderate solution conductivity for the electroplating process, so that the cuprous species or cupric species is attracted to the substrate cathode in the presence of a forward bias.

Figure 1B:
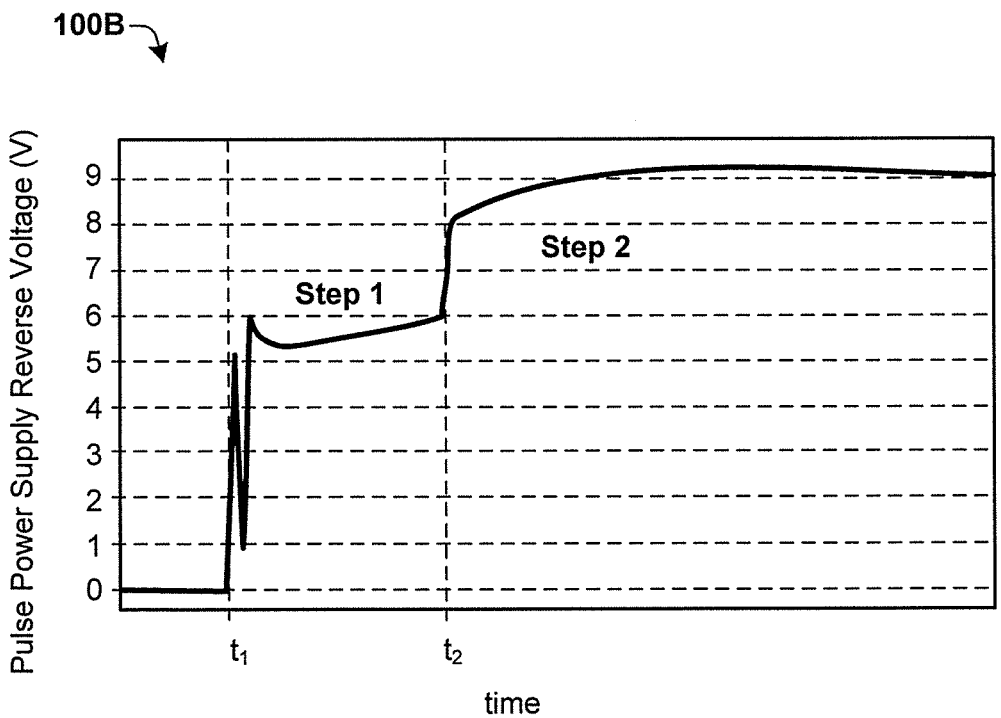

When the ECP system is left idle for a sustained period (i.e., on the order of days), the additives can dissociate from the electroplating solution and accumulate over the cationic membrane. FIG. 1B illustrates a voltage vs. time characteristic 100B of the three-step ECP process after a sustained idle period by an ECP system. The additives accumulated over and absorbed by the cationic membrane block the ionized protons $H^+$ from diffusing though the cationic membrane in the presence of the DC bias (i.e., no current results from the applied voltage), resulting in abnormally high voltages for the first and second durations, which drives the ECP process outside of acceptable manufacturing limits. To avoid this issue during idle periods, a dummy wafer is run through the ECP process approximately every 30 minutes, which wastes resource and increases cost, particularly for 300 mm and 450 mm wafer manufacturing due to increased substrate area.

Accordingly, the present disclosure relates to an electro-chemical plating (ECP) process which utilizes a dummy electrode as a cathode to perform plating for sustained idle times to mitigate additive dissociation. The dummy electrode also allows for localized plating function to improve product gapfill, and decrease wafer non-uniformity. A wide range of electroplating recipes may be applied with this strategy, comprising current plating up to approximately 200 Amps, localized plating with a resolution of approximately 1 mm, and reverse plating to remove material from the dummy electrode accumulated during the dummy plating process and replenish ionic material within the electroplating solution.

Figure 2:
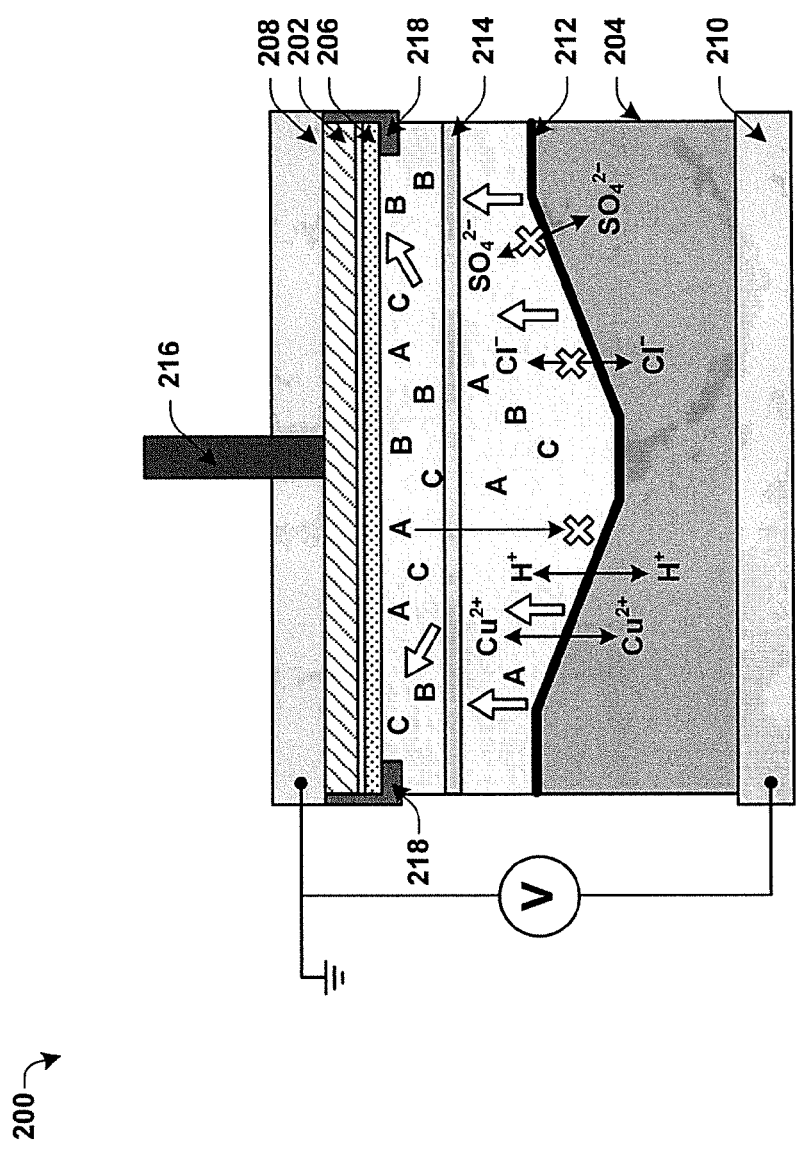
FIG. 2 illustrates some embodiments of an electro-chemical plating (ECP) system comprising a dummy cathode electrode.

FIG. 2 illustrates some embodiments of an electro-chemical plating (ECP) system 200 comprising a dummy electrode 202. The ECP system 200 further comprises a container 204 configured to hold an electroplating solution comprising a plurality of ionized molecules of a material to be deposited. In some embodiments, the electroplating solution comprises a copper sulfate $CuSO_4$ and hydrochloric acid HCl, wherein copper sulfate solution dissociates into cupric ($Cu^{2+}$) ions and $SO_4^{2-}$ ions. The $Cu^{2+}$ ions are reduced to metallic copper over the surface of a substrate 206. In some embodiments, the substrate 206 may comprise a semiconductor substrate (e.g., a silicon substrate, a GaAs substrate, etc.) having a surface topology with one or more cavities or trenches. The electroplating solution further comprises organic additives comprising a levelers (A) such as thiourea, benzotriazole (BTA), or Janus Green B (JGB), accelerators (B) such as bis(sodiumsulfopropyl)disulfide (SPS), and suppressors (C) such as polyethylene glycol (PEG) and polypropylene glycol (PPG).

A cathode 208 is disposed within the electroplating solution, and is electrically connected to the dummy electrode 202. In some embodiments, the dummy electrode 202 replaces the substrate 206 after long idle times so that a cationic membrane 212 may be purged of accumulated additives, and the ECP system 200 can return to normal operation. An anode 210 is separated from the electroplating solution by the cationic membrane 212 configured to selectively pass ionized protons $H^+$ to the electroplating solution. The substrate 206 or dummy electrode 202 is separated from the cationic membrane 212 by a diffuser 214 configured to selectively pass the ionized cupric species to the substrate 206 or dummy electrode 202 the presence of a forward bias from a voltage source. The dummy electrode 202 may be positioned by a positioning arm 216. In some embodiments, the substrate 206 is held in contact with, and hence electrically connected to the dummy electrode 202 by a substrate mount 218 so that the dummy electrode 202 may bias the substrate 206, such that the substrate 206 acts as the cathode whereupon the material is deposited.

Figure 3A:
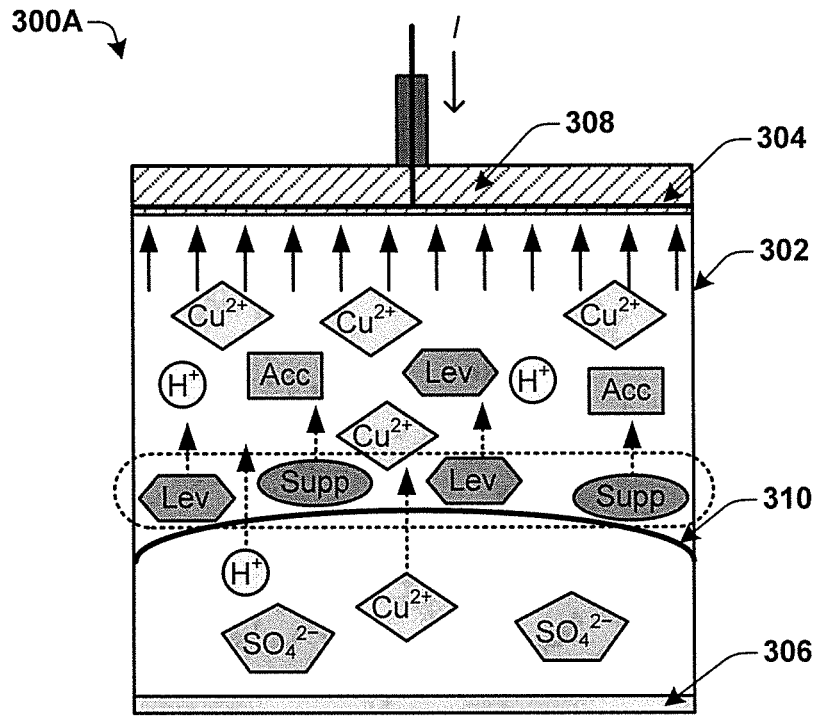
FIGS. 3A-3B illustrate some embodiments of plating process of a dummy electrode and a reverse plating process of the dummy electrode within an electro-chemical plating (ECP) system.

FIG. 3A illustrates some embodiments of plating process of a dummy electrode within an electro-chemical plating (ECP) system 300A comprising a container 302 wherein an electroplating solution resides, the electroplating solution comprises copper sulfate ($CuSO_4$) configured to act as a seed layer or a growth layer over a substrate, and thiourea, benzotriazole, or Janus Green B configured as a leveler (Lev), bis(sodiumsulfopropyl)disulfide configured as an accelerator (Acc), and polyethylene glycol or polypropylene glycol configured as a suppressor (Supp).

During an idle period wherein no EPC process takes place in the ECP system 300, a dummy electrode 304 replaces a position of the substrate and acts as a cathode under a forward bias comprising a voltage between an anode 306 and the dummy electrode 304, whereupon $Cu^{2+}$ is formed by oxidizing the Cu anode 306, and introduced into the electroplating solution with a conductivity moderated by the $H^+$ protons. The ionized $Cu^{2+}$ are attracted to a surface of the dummy electrode 304. The dummy electrode 304 is disposed over a backside substrate 308 and configured receive a current (I) from a current source through the backside substrate 308. In some embodiments the current is between approximately 0 Amps and approximately 200 Amps and generates the bias on the dummy electrode 304. Some embodiments comprise periodically providing a voltage between the anode 306 and the dummy electrode 304 with a first periodicity of approximately 30 minutes for an idle period between lot-to-lot plating until a substrate is provided into the electroplating solution to resume the ECP process.

Figure 3B:
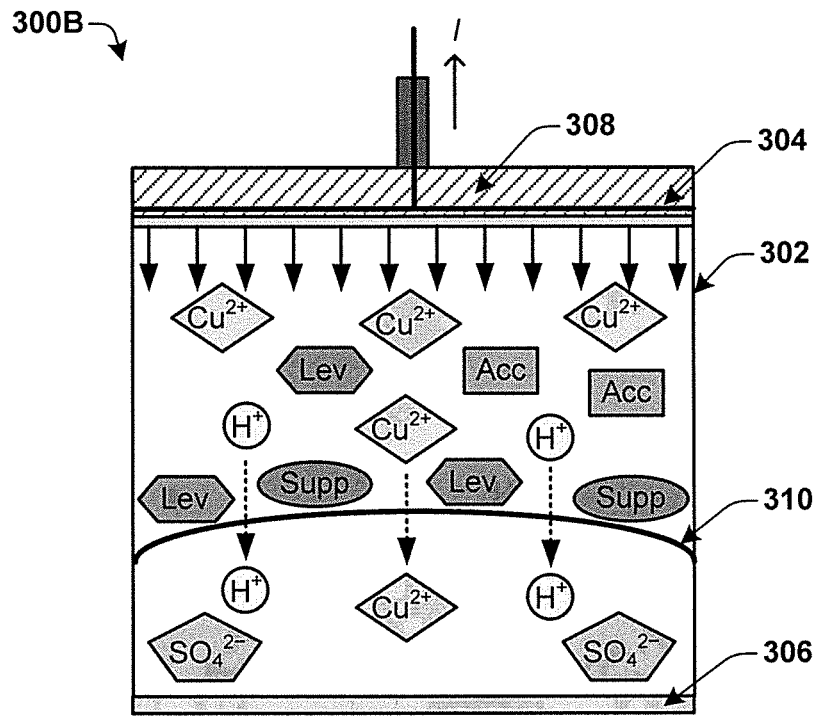

FIG. 3B illustrates some embodiments of plating process of a dummy electrode and a reverse plating process of the dummy electrode within an electro-chemical plating (ECP) system 300B, wherein the ECP system 300B is configured in accordance with the embodiments of ECP system 300A. During the dummy plating process set forth in the embodiments of FIG. 3A, $Cu^{2+}$ is reduced to Cu and deposited over a front surface of the dummy electrode 304. Reverse plating oxidizes Cu to form $Cu^{2+}$ over the front surface of dummy electrode 304 and accelerates the $Cu^{2+}$ back into the electroplating solution to replenish the source material for layer growth. In some embodiments, the reverse bias is periodically applied to the dummy electrode 304 with a second periodicity to ionize the material deposited over the front surface of the dummy electrode 304, whereupon the ionized material migrates from the front surface of the dummy electrode 304 into the electroplating solution.

Figure 4A:
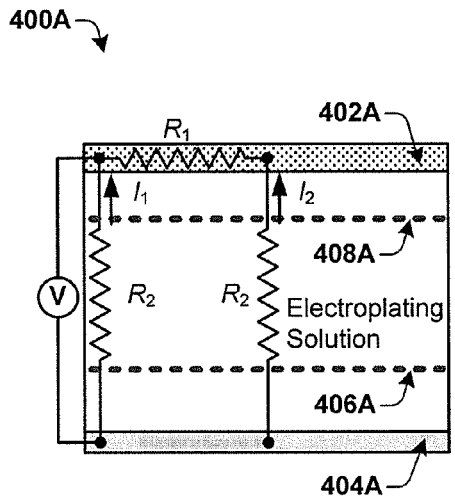
FIGS. 4A-4C illustrate some embodiments a localized plating process within an electro-chemical plating (ECP) system with a dummy electrode configured for local biasing.
Figure 4B:
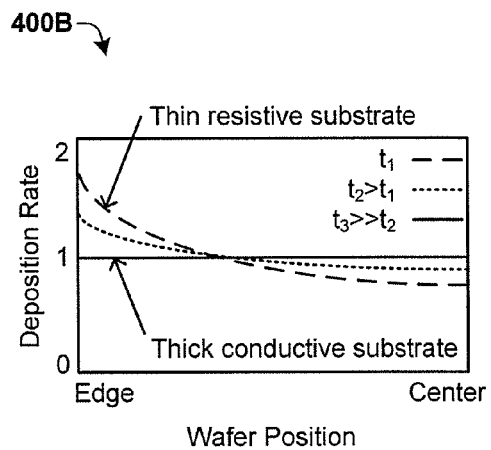

In some embodiments, local biasing of the substrate is desired to deposit materials with a non-uniform thickness, or to offset a non-uniform deposition resulting from conditions such as the terminal effect. FIG. 4A illustrates some embodiments of container 400A within an electro-chemical plating (ECP) system, wherein a potential drop across a substrate 402A can cause non-uniformities in the current density distribution within the substrate 402A, and may be modeled as a first resistance $R_1$ which acts radially across the substrate 402A. As shown in the embodiments of the graph 400B of deposition rate as a function of radial substrate position in FIG. 4B, the terminal effect leads to a higher deposition rate at the substrate (402A) edge compared to the center. As a thickness of the substrate is increased, the first resistance $R_1$ decreases and the deposition rate increases in uniformity as a function of radial position. Ionized particles within an electroplating solution residing between a first membrane 406A and a second membrane 408A within the container 400A respond to a bias between an anode 404A and the substrate 402A (i.e., cathode) and are accelerated towards the substrate 402A, passing through the second membrane 408A. The movement of these ionized particles (e.g., $Cu^{2+}$) can be modeled as a current which is subject to a second resistance $R_2$ within the electroplating solution which is oriented normal to the substrate 402A surface, and which varies radially due to the radial potential drop ($R_1$) across the substrate 402A (e.g., $I_1 > I_2$), resulting in a higher deposition rate at the edge of substrate 402A than in the center. Note that for $R_2 \gg R_1$ the terminal effect is negligible and $I_1$ and $I_2$ are approximately equal, resulting in a uniform deposition rate and hence uniform thickness of material deposited over the substrate 402A.

Figure 4C:
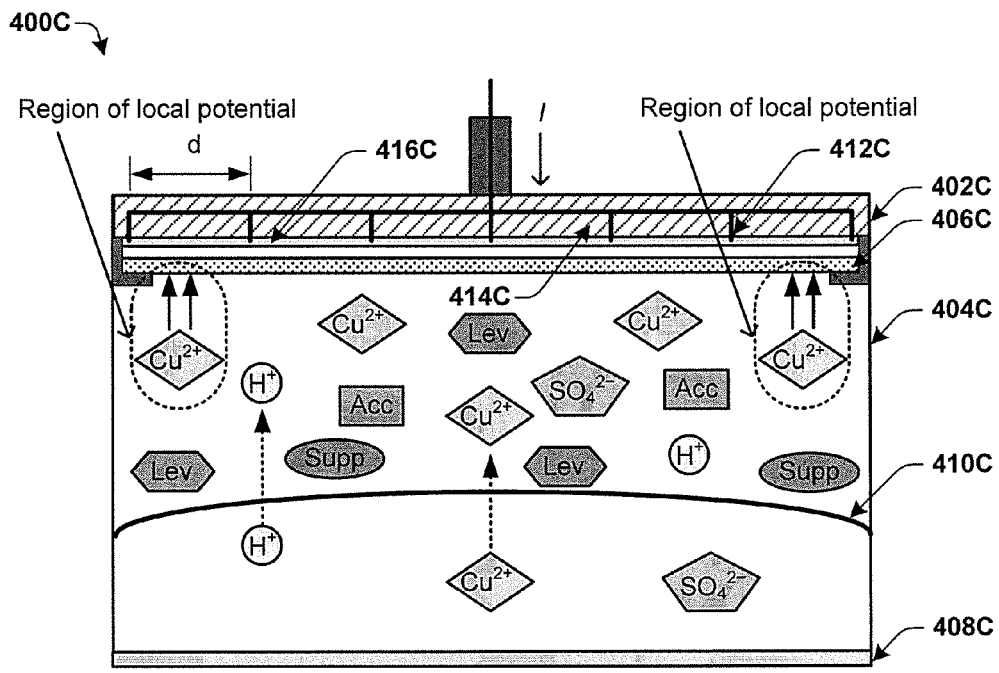

FIG. 4C illustrates some embodiments a localized plating process within an electro-chemical plating (ECP) system 400C with a dummy electrode 402C configured for local biasing. The ECP system 400C comprises a container 404C wherein an electroplating solution resides. The electroplating solution comprises copper sulfate ($CuSO_4$) configured for deposition over a substrate 406C, along with additives comprising levelers (Lev), accelerators (Acc), and suppressors (Supp). An anode 408C is positioned opposite the dummy electrode 402C and is segregated from the dummy electrode 402C and substrate 406C by a cationic membrane 410C configured to pass ionized protons ($H^+$) into the electroplating solution. The dummy electrode 402C comprises localized wiring 412C distributed within a backside substrate 414C, the localized wiring 412C is configured to deliver current (I) to a front surface of the backside substrate 414C, and the current generates the local bias to the substrate 406C. In some embodiments of a dummy plating process during an idle period of the ECP system 400C, the dummy electrode 402C accumulates a pure Cu film 416C.

During a localized ECP process, the ECP system 400C applies a uniform bias to the anode 408C, and a local bias to the dummy electrode 402C through the localized wiring 412C, wherein the substrate 406C is coupled to the dummy electrode 402C configured to apply the local bias to the substrate 406C through the localized wiring 412C. The uniform bias promotes diffusion of ions of the electroplating solution towards the substrate 406C. The local bias attracts a majority of the ions to regions of the substrate 406C to which the local bias is applied, resulting in a non-uniform deposition thickness of the material over the substrate 406C.

Figure 5A:
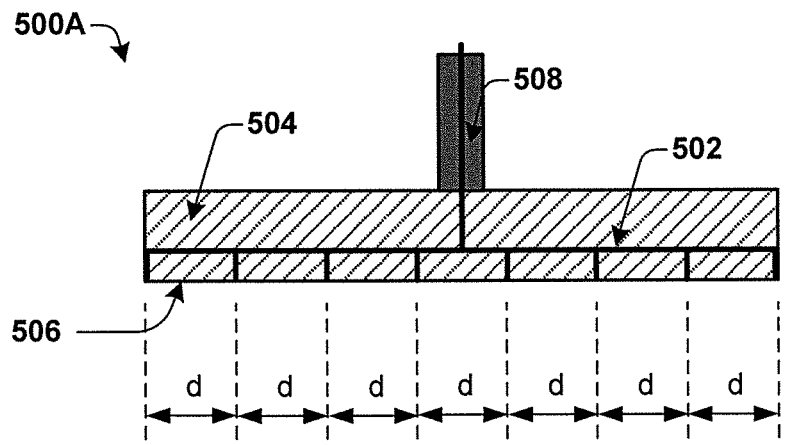
FIGS. 5A-5B illustrate some embodiments of localized wiring within a dummy electrode.
Figure 5B:
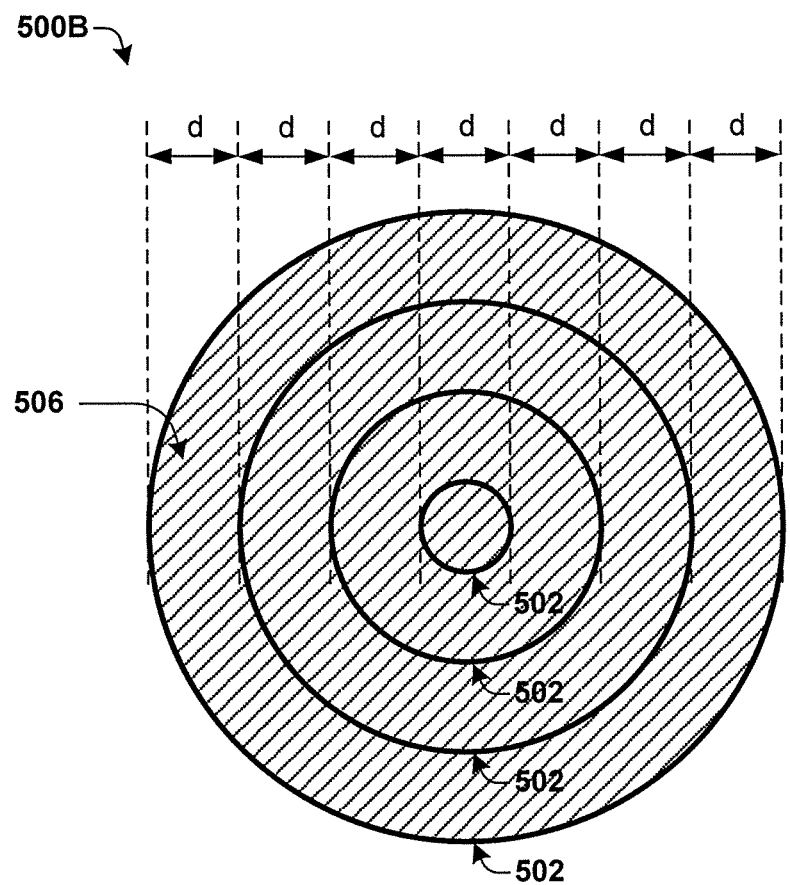

FIG. 5A illustrates some embodiments of a dummy electrode 500A. The dummy electrode 500A comprises localized wiring 502 distributed within a backside substrate 504. The localized wiring 502 is configured to deliver current to a front surface 506 of the backside substrate 504 to generate the local bias on the front surface 506. The localized wiring 502 may be distributed in a pattern on the front surface 506. FIG. 5B illustrates a bottom-up view 500B of the dummy electrode 500A, wherein the localized wiring 502 comprises a periodic pattern of concentric rings distributed with spacing (d) between approximately 1 mm and approximately 300 mm. It will be appreciated that in other embodiments the periodic pattern may comprise lines, a grid, or any regular periodic pattern.

Figure 6:
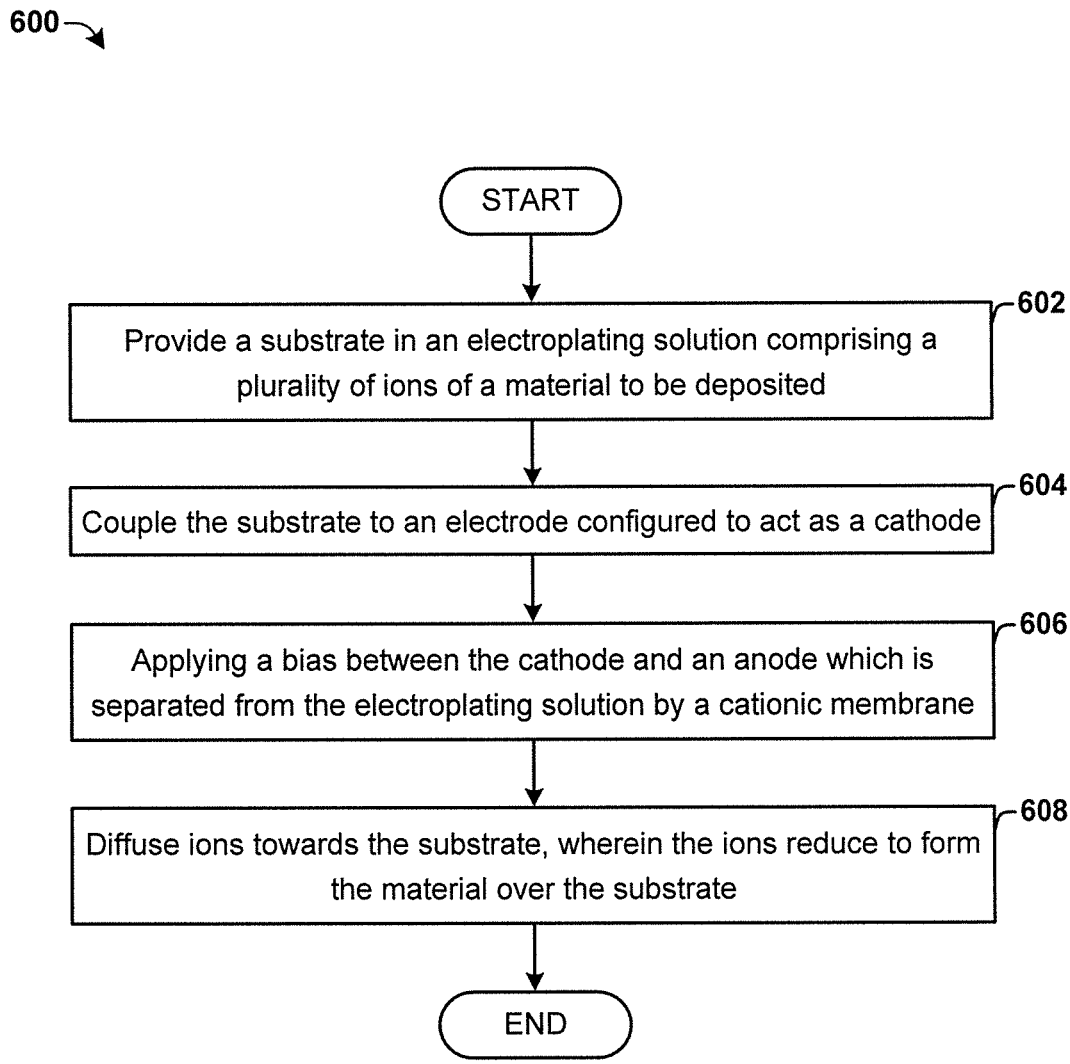
FIG. 6 illustrates a flow diagram of some embodiments of a method of performing a localized electro-chemical plating (ECP) process with a dummy electrode configured for local biasing.
Figure 7:
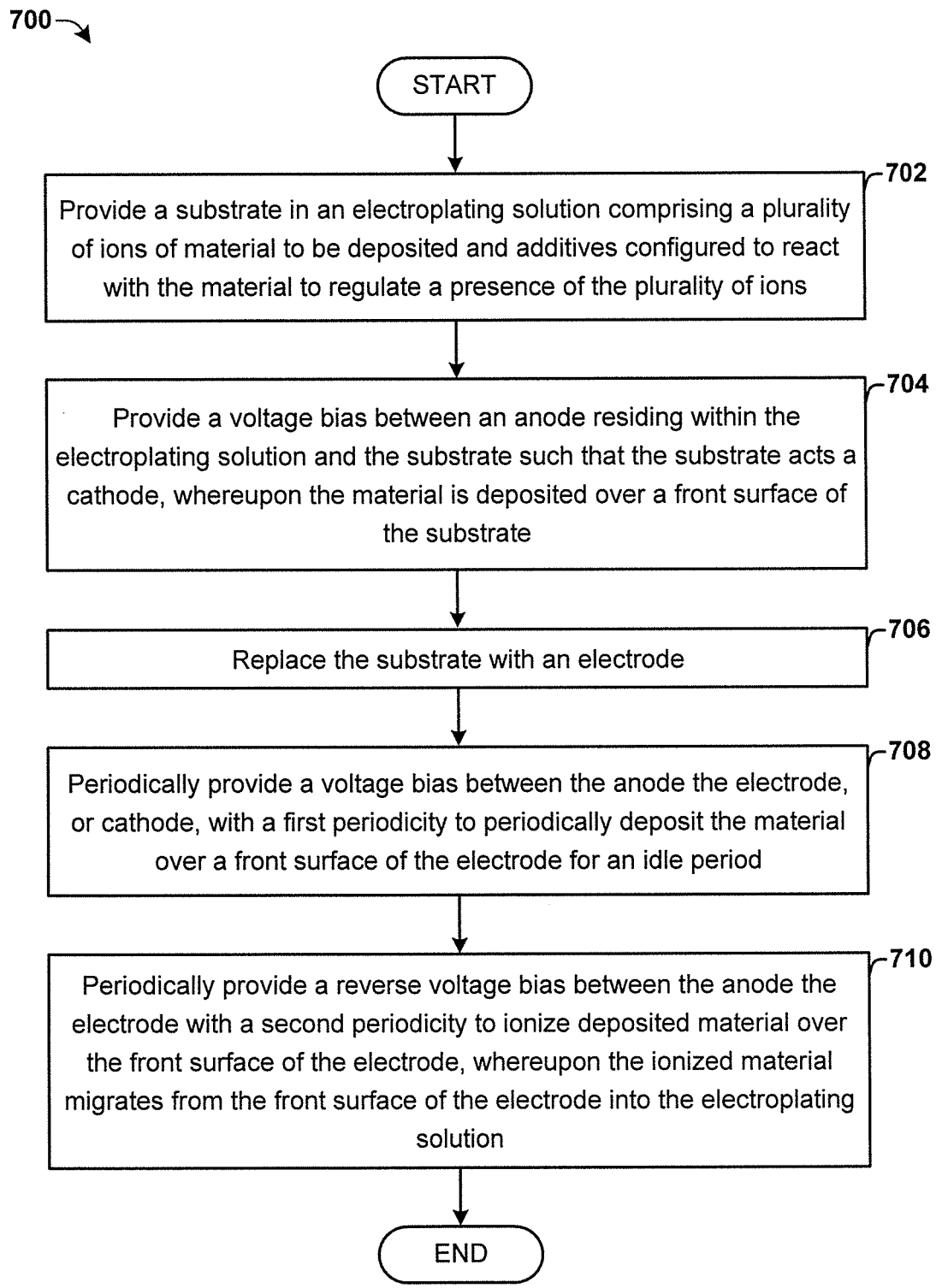
FIG. 7 illustrates a flow diagram of some embodiments of a method of performing an electro-chemical plating (ECP) process comprising purging of membrane of additive contaminants after a sustained idle period with a dummy electrode.

FIGS. 6-7 illustrate flow diagrams 600 and 700 of some embodiments of methods of performing an electro-chemical plating (ECP) processes. While the disclosed methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 6 illustrates a flow diagram 600 of some embodiments of a method of performing a localized electro-chemical plating (ECP) process with a dummy electrode configured for local biasing.

At 602 a substrate is provided in an electroplating solution of an ECP system, the electroplating solution comprising a plurality of ions of a material to be deposited, such as an ionized cuprous species or an ionized cupric species configured to act as a seed layer or a growth layer over the substrate, and thiourea, benzotriazole, or Janus Green B configured as a leveler, bis(sodiumsulfopropyl)disulfide configured as an accelerator, or polyethylene glycol or polypropylene glycol configured as a suppressor.

At 604 the substrate is coupled to an electrode configured to act as a cathode. In some embodiments, the electrode is configured to apply a local bias to the substrate through localized wiring distributed within a backside substrate of the electrode.

At 606 a bias is applied between the cathode and an anode which is separated from the electroplating solution by a cationic membrane.

At 608 the bias promotes diffusion of the ions of the electroplating solution towards the substrate, and the ions reduce to form the material over the substrate. In some embodiments, a local bias attracts a majority of the ions to regions of the substrate to which the local bias is applied, resulting in a non-uniform deposition thickness of the material over the substrate.

In some embodiments of the method of FIG. 6 the material disposed over the substrate in a three-step process. The three-step process comprises a first step comprising deposition of an material layer (e.g., Cu) over one or more seed layers to fill comparatively narrow trenches (e.g., a pattered dielectric layer) and vias which is performed with a first bias comprising a voltage between approximately 0 Volts and approximately 5 Volts for a first duration of less than approximately one minute. A second step comprises filling comparatively wide trenches within the substrate performed with a second bias comprising a voltage between approximately 5 Volts and approximately 10 Volts for a second duration of greater than approximately one minute. A third step comprises deposition of a bulk film performed with a third bias comprising a voltage greater than approximately 10 Volts for a third duration of less than approximately one minute.

FIG. 7 illustrates a flow diagram 700 of some embodiments of a method of performing an electro-chemical plating (ECP) process comprising purging of membrane of additive contaminants after a sustained idle period with a dummy electrode.

At 702 a substrate is provided in an electroplating solution within an ECP system, the electroplating solution comprising a plurality of ions of material to be deposited, and additives configured to react with the material to regulate the presence of the plurality of ions.

At 704 a voltage is provided between an anode residing within the electroplating solution and the substrate, such that the substrate acts a cathode, whereupon the material is deposited over a front surface of the substrate.

At 706 the substrate is replaced with an electrode.

At 708 a forward voltage is periodically provided between the anode and the electrode with a first periodicity, such that the electrode acts a cathode, whereupon the material is periodically deposited over a front surface of the electrode for an idle period until the electrode is replaced with another substrate.

At 710 a reverse voltage is periodically applied to the electrode with a second periodicity to ionize the material deposited over the front surface of the electrode, whereupon the ionized material migrates from the front surface of the electrode into the electroplating solution.

It will be appreciated that while reference is made throughout this document to exemplary structures in discussing aspects of methodologies described herein, those methodologies are not to be limited by the corresponding structures presented. Rather, the methodologies and structures are to be considered independent of one another and able to stand alone and be practiced without regard to any of the particular aspects depicted in the Figs.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to an electro-chemical plating (ECP) process which utilizes a dummy electrode as a cathode to perform plating for sustained idle times to mitigate additive dissociation. The dummy electrode also allows for localized plating function to improve product gapfill, and decrease wafer non-uniformity. A wide range of electroplating recipes may be applied with this strategy, comprising current plating up to approximately 200 Amps, localized plating with a resolution of approximately 1 mm, and reverse plating to remove material from the dummy electrode accumulated during the dummy plating process and replenish ionic material within the electroplating solution.

In some embodiments, the present disclosure relates to a method of electro-chemical plating. The method comprises providing a substrate in an electroplating solution comprising a plurality of ions of a material to be deposited, coupling the substrate to an electrode configured to apply a local bias to the substrate, and applying a uniform bias to an anode. The uniform bias promotes diffusion of the ions of the electroplating solution towards the substrate, and the local bias attracts a majority of the ions to regions of the substrate to which the local bias is applied, resulting in a non-uniform deposition thickness of the material over the substrate.

In other embodiments, the present disclosure relates to a method of electro-chemical plating. The method comprises providing a substrate in an electroplating solution comprising a plurality of ions of material to be deposited, and additives configured to react with the material to regulate the presence of the plurality of ions. The method further comprises providing a voltage between an anode residing within the electroplating solution and the substrate, such that the substrate acts a cathode, whereupon the material is deposited over a front surface of the substrate, replacing the substrate with a electrode, and periodically providing a voltage between the anode and the electrode with a first periodicity, such that the electrode acts a cathode. The material is periodically deposited over a front surface of the electrode for an idle period until the electrode is replaced with another substrate.

In other embodiments, the present disclosure relates to an electro-chemical plating (ECP) system, comprising an electroplating solution further comprising a plurality of ionized molecules of a material to be deposited, and an electrode disposed within the electroplating solution and configured to act as a cathode, or to electrically connected to a substrate, whereupon the substrate acts as a cathode. The electrode is configured to receive periodic bias applied between an anode and the electrode by a voltage source when the electrode is disconnected from the substrate for and idle period, whereupon the material is periodically deposited over a front surface of the electrode.

What is claimed is:

1. A method of electro-chemical plating, comprising:
   providing a semiconductor substrate in an electroplating solution comprising a plurality of ions of a material to be deposited;
   coupling the semiconductor substrate to an electrode configured to act as a cathode;
   applying a first bias between the cathode and an anode which is separated from the electroplating solution by a cationic membrane;
   wherein the bias promotes diffusion of the ions of the electroplating solution towards the semiconductor substrate, and wherein the ions reduce to form the material over the semiconductor substrate;
   removing the semiconductor substrate from the electroplating solution after the material has been deposited; and
   after removing the semiconductor substrate from the electroplating solution and before putting another semiconductor substrate in the electroplating solution, putting the electrode in direct contact with the electroplating solution and applying a second bias between the electrode and the anode over the electroplating solution.

2. The method of claim 1, wherein the electrode is configured to apply a local bias to the substrate, and wherein the local bias attracts a majority of the ions to regions of the substrate to which the local bias is applied, resulting in a non-uniform deposition thickness of the material over the substrate.

3. The method of claim 2, wherein the electrode comprises localized wiring distributed within a backside substrate, wherein the localized wiring is configured to deliver a current to a front surface of the backside substrate, and wherein the current generates the local bias to the substrate.

4. The method of claim 3, wherein the localized wiring is distributed with a spacing of between approximately 1 millimeter (mm) and approximately 300 mm.

5. The method of claim 4, wherein the localized wiring comprises a pattern including concentric rings of continuous wiring.

6. The method of claim 3, wherein the current is between approximately 0 Amps and approximately 200 Amps.

7. The method of claim 1, wherein the electroplating solution comprises ionized cuprous species or an ionized cupric species configured to act as a seed layer or a growth layer over the substrate.

8. The method of claim 7, wherein the electroplating solution further comprises:
   thiourea, benzotriazole, or Janus Green B configured as a leveler;
   bis(sodiumsulfopropyl) disulfide configured as an accelerator; or
   polyethylene glycol or polypropylene glycol configured as a suppressor.

9. The method of claim 1, wherein the first bias comprises a voltage between approximately 0 Volts and approximately 10 Volts.

10. A method of electro-chemical plating, comprising:
    providing a semiconductor substrate in an electroplating solution comprising:
    a plurality of ions of material to be deposited; and
    additives configured to react with the material to regulate a presence of the plurality of ions;
    coupling the semiconductor substrate to an electrode;
    providing a voltage between an anode residing within the electroplating solution and the electrode, such that the semiconductor substrate acts a cathode, whereupon the material is deposited over a front surface of the semiconductor substrate;

decoupling the semiconductor substrate from the electrode and removing the semiconductor substrate from the electroplating solution; and after removing the semiconductor substrate from the electroplating solution and before putting another semiconductor substrate in the electroplating solution, putting the electrode in direct contact with the electroplating solution and applying a bias between the electrode and the anode.

11. The method of claim 10, wherein a reverse bias is periodically applied to the electrode with a periodicity.

12. The method of claim 11, wherein the periodicity comprises approximately 30 minutes.

13. The method of claim 10, wherein the electrode is disposed over a backside substrate and configured receive a current from a current source through the backside substrate, and wherein the current is between approximately 0 Amps and approximately 200 Amps and generates a bias on the electrode.

14. The method of claim 10, wherein the electroplating solution comprises ionized cuprous species or an ionized cupric species configured to act as a seed layer or a growth layer over the substrate.

15. The method of claim 14, wherein the electroplating solution further comprises:

thiourea, benzotriazole, or Janus Green B configured as a leveler;

bis(sodiumsulfopropyl) disulfide configured as an accelerator; or polyethylene glycol or polypropylene glycol configured as a suppressor.

16. A method of electro-chemical plating (ECP), comprising:

providing an ECP system configured to perform an electroplating process on a substrate, the ECP system comprising an electroplating solution arranged between a first electrode and a second electrode;

coupling the substrate to the first electrode and positioning the substrate in direct contact with the electroplating solution and applying a first voltage between the first and second electrodes while the substrate is in direct contact with the electroplating solution, wherein applying the first voltage reduces ions of the electroplating solution into a first deposit on the substrate;

removing the substrate from the electroplating solution after the first voltage has been applied; and after removing the substrate from the electroplating solution and before putting another substrate in the electroplating solution, putting the first electrode in direct contact with the electroplating solution and applying a second voltage between the first and second electrodes, wherein applying the second voltage reduces ions of the electroplating solution into a second deposit on the first electrode.

17. The method of claim 16, further comprising: applying a third voltage between the first and second electrodes to remove the second deposit from the first electrode.

18. The method of claim 17, wherein applying the first voltage between the first and second electrodes comprises: applying a first initial voltage between the first and second electrodes to fill first openings in the substrate with the first deposit; and applying a second initial voltage between the first and second electrodes to fill second openings in the substrate with the first deposit, wherein the second openings have a larger width than the first openings, and wherein the second initial voltage is larger than the first initial voltage.

19. The method of claim 16, wherein the electroplating solution comprises ionized cuprous species or an ionized cupric species.

* * * * *